United States Patent
Zhong et al.

(10) Patent No.: US 10,404,213 B2
(45) Date of Patent: Sep. 3, 2019

(54) METHOD FOR CONTROLLING SUPPLY VOLTAGE OF POWER AMPLIFIER, AND ELECTRONIC DEVICE

(71) Applicant: Huawei Technologies Co., Ltd., Shenzhen (CN)

(72) Inventors: Meifang Zhong, Wuhan (CN); Yanbiao Luo, Wuhan (CN); Konggang Wei, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 287 days.

(21) Appl. No.: 15/500,168

(22) PCT Filed: Jul. 30, 2014

(86) PCT No.: PCT/CN2014/083344
§ 371 (c)(1),
(2) Date: Jan. 30, 2017

(87) PCT Pub. No.: WO2016/015256
PCT Pub. Date: Feb. 4, 2016

(65) Prior Publication Data
US 2017/0264244 A1   Sep. 14, 2017

(51) Int. Cl.
*H03F 1/02* (2006.01)
*H04W 52/02* (2009.01)
(Continued)

(52) U.S. Cl.
CPC ............... *H03F 1/02* (2013.01); *H03F 1/025* (2013.01); *H03F 3/189* (2013.01); *H03F 3/20* (2013.01);
(Continued)

(58) Field of Classification Search
CPC ........................................................ H03F 1/02
See application file for complete search history.

(56) References Cited

U.S. PATENT DOCUMENTS 6,614,310 B2   9/2003   Quarfoot et al.
7,317,352 B2 * 1/2008   Grundlingh ........... H03F 1/0211
                                                         330/129
(Continued)

FOREIGN PATENT DOCUMENTS

CN   101557238 A   10/2009
CN   101908859 A   12/2010
(Continued)

*Primary Examiner* — Patricia T Nguyen
(74) *Attorney, Agent, or Firm* — Slater Matsil, LLP

(57) ABSTRACT

A method for controlling a supply voltage of a power amplifier, and an electronic device are provided. The method includes acquiring a state of an envelope of a to-be-amplified signal, where the state of the envelope includes a rising edge and a falling edge; acquiring a first voltage corresponding to the envelope when the state of the envelope is the falling edge, and controlling the supply voltage of the power amplifier according to the first voltage. The method also includes acquiring a second voltage corresponding to a maximum peak value of the to-be-amplified signal in a first preset time when the state of the envelope is the rising edge, and controlling, according to the second voltage, the supply voltage of the power amplifier in the first preset time.

11 Claims, 5 Drawing Sheets

(51) Int. Cl.
*H03F 3/189* (2006.01)
*H03F 3/20* (2006.01)

(52) U.S. Cl.
CPC ....... *H04W 52/02* (2013.01); *H03F 2200/102* (2013.01); *H03F 2200/129* (2013.01)

(56) References Cited

U.S. PATENT DOCUMENTS

| | | | | |
|---|---|---|---|---|
| 9,484,876 | B2* | 11/2016 | Park | H03G 3/3005 |
| 2009/0160548 | A1* | 6/2009 | Ishikawa | H03F 1/0227 330/136 |
| 2009/0278610 | A1* | 11/2009 | Murji | H03F 1/52 330/298 |
| 2010/0321115 | A1 | 12/2010 | Mohajeri et al. | |
| 2011/0031953 | A1 | 2/2011 | Kanbe et al. | |
| 2011/0223875 | A1* | 9/2011 | Hamano | H03F 1/0222 455/127.1 |
| 2012/0052823 | A1 | 3/2012 | Langer | |
| 2012/0262232 | A1 | 10/2012 | Sukegawa et al. | |
| 2013/0099861 | A1 | 4/2013 | Zhang | |
| 2014/0361830 | A1* | 12/2014 | Mathe | H03F 1/02 330/127 |
| 2015/0194942 | A1* | 7/2015 | Anderson | H03F 3/213 330/295 |

FOREIGN PATENT DOCUMENTS

| | | |
|---|---|---|
| CN | 101938258 A | 1/2011 |
| CN | 101939900 A | 1/2011 |
| CN | 102394586 A | 3/2012 |
| CN | 102437860 A | 5/2012 |
| CN | 102598504 A | 7/2012 |
| EP | 2073380 A2 | 6/2009 |
| EP | 2270975 A2 | 1/2011 |
| EP | 2367282 A2 | 9/2011 |
| EP | 2432120 A1 | 3/2017 |

* cited by examiner

METHOD FOR CONTROLLING SUPPLY VOLTAGE OF POWER AMPLIFIER, AND ELECTRONIC DEVICE

CROSS-REFERENCE TO RELATED APPLICATIONS

This application is a national stage of International Application No. PCT/CN2014/083344, filed on Jul. 30, 2014, which is hereby incorporated by reference in its entirety.

TECHNICAL FIELD

The present invention relates to the field of communications technologies, and in particular, to a method for controlling a supply voltage of a power amplifier, and an electronic device.

BACKGROUND

At present, in an electronic apparatus (for example, a wireless terminal product) for transmitting and processing data, a power amplifier is generally required for performing corresponding processing on a data signal, and in an operating process, the power amplifier requires the electronic apparatus to provide electric energy required by the power amplifier for operation. An electronic apparatus in the prior art generally supplies power to a power amplifier by using a direct current to direct current converter (DCDC for short).

Due to impact of a discrete manufacturing process, a minimum operating voltage value of a power amplifier is discretely distributed. To ensure that power amplifiers in mass-produced electronic apparatuses can properly operate, a voltage value of power supplied by a DCDC to the power amplifiers is generally much higher than a minimum operating voltage value specified by a power amplifier vendor. Therefore, a blank area of a dropout voltage exists between the supply voltage of the power amplifiers and an actual operating voltage value. An excessive part of the supply voltage compared with the actual operating voltage is converted into heat and consumed, which increases a power loss.

SUMMARY

A method for controlling a supply voltage of a power amplifier, and an electronic device that are provided in embodiments of the present invention resolve a problem of high power consumption caused when the supply voltage of the power amplifier is much higher than an actual operating voltage.

To achieve the foregoing objective, the following technical solutions are used in the embodiments of the present invention.

According to a first aspect, an embodiment of the present invention provides a method for controlling a supply voltage of a power amplifier. The method includes acquiring a state of an envelope of a to-be-amplified signal, where the state of the envelope includes a rising edge and a falling edge. The method also includes acquiring a first voltage corresponding to the envelope when the state of the envelope is the falling edge, and controlling the supply voltage of the power amplifier according to the first voltage. The method also includes acquiring a second voltage corresponding to a maximum peak value of the to-be-amplified signal in a first preset time when the state of the envelope is the rising edge, and controlling, according to the second voltage, the supply voltage of the power amplifier in the first preset time.

In a first possible implementation manner of the first aspect, with reference to the first aspect, the acquiring a second voltage corresponding to a maximum peak value of the to-be-amplified signal in a first preset time when the state of the envelope is the rising edge specifically includes: acquiring the maximum peak value of the to-be-amplified signal in the first preset time when the state of the envelope is the rising edge; and searching a peak value and voltage correspondence table for a voltage corresponding to the maximum peak value of the to-be-amplified signal in the first preset time, to obtain the second voltage.

In a second possible implementation manner of the first aspect, with reference to the first aspect and the first possible implementation manner of the first aspect, the first preset time is less than duration of a data frame.

In a third possible implementation manner of the first aspect, with reference to the first aspect to the second possible implementation manner of the first aspect, before the acquiring a state of an envelope of a to-be-amplified signal, where the state of the envelope includes a rising edge and a falling edge, the method further includes: acquiring the to-be-amplified signal, and delaying the to-be-amplified signal for a second preset time, so that the to-be-amplified signal is synchronous with the supply voltage of the power amplifier.

According to a second aspect, an embodiment of the present invention provides an electronic device. The electronic device includes: an acquiring unit, configured to acquire a state of an envelope of a to-be-amplified signal, where the state of the envelope includes a rising edge and a falling edge, where the acquiring unit is further configured to acquire a first voltage corresponding to the envelope when the state of the envelope is the falling edge. The electronic device also includes a control unit, configured to control a supply voltage of a power amplifier according to the first voltage, where the acquiring unit is further configured to acquire a second voltage corresponding to a maximum peak value of the to-be-amplified signal in a first preset time when the state of the envelope is the rising edge. The control unit is further configured to control, according to the second voltage, the supply voltage of the power amplifier in the first preset time.

In a first possible implementation manner of the second aspect, with reference to the second aspect, the acquiring unit is specifically configured to acquire the maximum peak value of the to-be-amplified signal in the first preset time when the state of the envelope is the rising edge, and search a peak value and voltage correspondence table for a voltage corresponding to the maximum peak value of the to-be-amplified signal in the first preset time, to obtain the second voltage.

In a second possible implementation manner of the second aspect, with reference to the second aspect and the first possible implementation manner of the second aspect, the first preset time is less than duration of a data frame.

In a third possible implementation manner of the second aspect, with reference to the second aspect to the second possible implementation manner of the second aspect, the electronic device further includes a delay unit, where the acquiring unit is further configured to acquire the to-be-amplified signal; and the delay unit is configured to delay the to-be-amplified signal for a second preset time, so that the to-be-amplified signal is synchronous with the supply voltage of the power amplifier.

According to a third aspect, an embodiment of the present invention provides an electronic device. The electronic device includes: an envelope detector, configured to acquire a state of an envelope of a to-be-amplified signal, where the state of the envelope includes a rising edge and a falling edge. The electronic device also includes a processor, configured to acquire a first voltage corresponding to the envelope when the state of the envelope is the falling edge, and control a supply voltage of a power amplifier according to the first voltage, where the processor is further configured to acquire a second voltage corresponding to a maximum peak value of the to-be-amplified signal in a first preset time when the state of the envelope is the rising edge, and control, according to the second voltage, the supply voltage of the power amplifier in the first preset time.

In a first possible implementation manner of the third aspect, with reference to the third aspect, the processor is specifically configured to acquire the maximum peak value of the to-be-amplified signal in the first preset time when the state of the envelope is the rising edge, and search a peak value and voltage correspondence table for a voltage corresponding to the maximum peak value of the to-be-amplified signal in the first preset time, to obtain the second voltage.

In a second possible implementation manner of the third aspect, with reference to the third aspect and the first possible implementation manner of the third aspect, the first preset time is less than duration of a data frame.

In a third possible implementation manner of the third aspect, with reference to the third aspect to the second possible implementation manner of the third aspect, the electronic device further includes a delay circuit, where the envelope detector is further configured to acquire the to-be-amplified signal; and the delay circuit is configured to delay the to-be-amplified signal for a second preset time, so that the to-be-amplified signal is synchronous with the supply voltage of the power amplifier.

According to the method for controlling a supply voltage of a power amplifier, and the electronic device that are provided in the embodiments of the present invention, a state of an envelope of a to-be-amplified signal is acquired, where the state of the envelope includes a rising edge and a falling edge; a first voltage corresponding to the envelope is acquired when the state of the envelope is the falling edge, and the supply voltage of the power amplifier is controlled according to the first voltage; and a second voltage corresponding to a maximum peak value of the to-be-amplified signal in a first preset time is acquired when the state of the envelope is the rising edge, and the supply voltage of the power amplifier is controlled in the first preset time according to the second voltage. Based on this solution, the supply voltage of the power amplifier may be determined by determining the state of the envelope of the to-be-amplified signal; and if the state of the envelope is the falling edge, the supply voltage of the power amplifier is controlled according to the first voltage corresponding to the envelope; or if the state of the envelope is the rising edge, the supply voltage of the power amplifier is controlled according to the second voltage corresponding to the maximum peak value of the envelope in the first preset time. This reduces a blank area of the supply voltage of the power amplifier and a power loss, so that the supply voltage of the power amplifier is approximately equal to an actual operating voltage of the power amplifier, which reduces power consumption, and avoids distortion of the to-be-amplified signal.

BRIEF DESCRIPTION OF THE DRAWINGS

To describe the technical solutions in the embodiments of the present invention or in the prior art more clearly, the following briefly describes the accompanying drawings required for describing the embodiments or the prior art. Apparently, the accompanying drawings in the following description show merely some embodiments of the present invention, and a person of ordinary skill in the art may still derive other drawings from these accompanying drawings without creative efforts.

DETAILED DESCRIPTION OF ILLUSTRATIVE EMBODIMENTS

The following clearly and completely describes the technical solutions in the embodiments of the present invention with reference to the accompanying drawings in the embodiments of the present invention. Apparently, the described embodiments are merely some but not all of the embodiments of the present invention. All other embodiments obtained by a person of ordinary skill in the art based on the embodiments of the present invention without creative efforts shall fall within the protection scope of the present invention.

Embodiment 1

Figure 1:
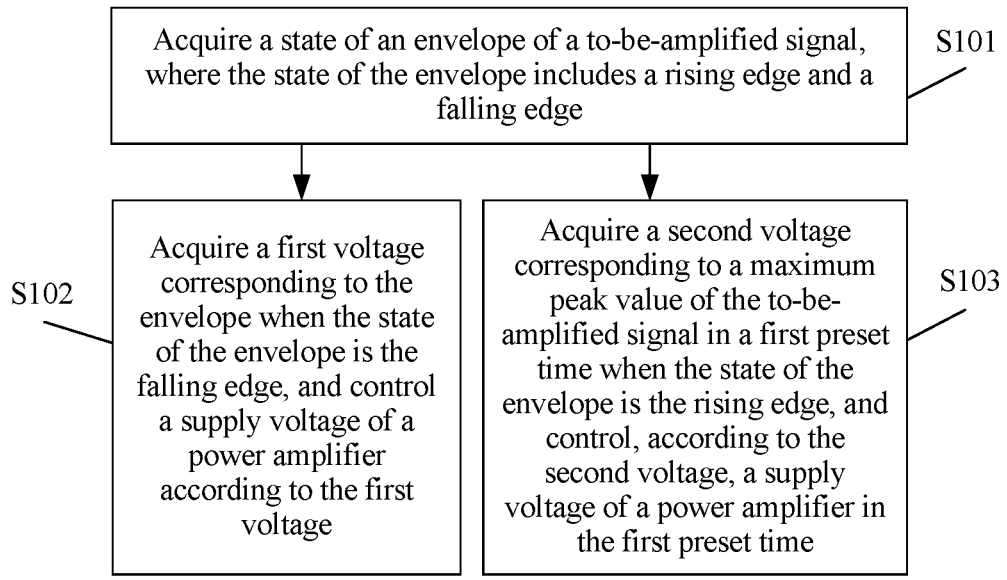
FIG. 1 is a schematic flowchart of a method for controlling a supply voltage of a power amplifier according to Embodiment 1 of the present invention.

This embodiment of the present invention provides a method for controlling a supply voltage of a power amplifier. As shown in FIG. 1, the method may include the following steps.

S101. Acquire a state of an envelope of a to-be-amplified signal, where the state of the envelope includes a rising edge and a falling edge.

It should be noted that the method for controlling a supply voltage of a power amplifier provided in this embodiment of the present invention may be executed by an electronic device, where the electronic device may be a mobile phone, a tablet computer, or the like, which is not limited in this embodiment.

Figure 2:
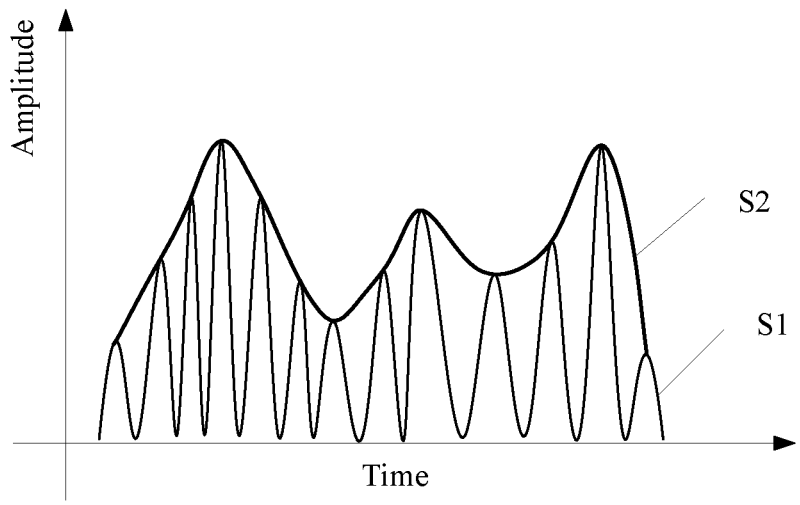
FIG. 2 is a schematic diagram of a to-be-amplified signal and an envelope of the to-be-amplified signal according to an embodiment of the present invention.

Specifically, before acquiring the state of the envelope of the to-be-amplified signal, the electronic device needs to first acquire the to-be-amplified signal, where the to-be-amplified signal may be a power signal (or a voltage signal), and then parses the to-be-amplified signal to acquire the envelope of the to-be-amplified signal. For a high-frequency amplitude-modulated signal, amplitude of the signal changes according to a low-frequency modulated signal. If peak points of the high-frequency amplitude-modulated signal are connected, a curve corresponding to the low-frequency modulated signal may be obtained, and the curve is the envelope. As shown in FIG. 2, S1 is the to-be-amplified signal, and S2 is the envelope of the to-be-amplified signal. Then, the state of the envelope of the to-be-amplified signal is determined, so as to determine that the state of the envelope is the rising edge or the falling edge.

It should be supplemented that in this embodiment, the to-be-amplified signal may be parsed by using an envelope detector, to obtain the envelope of the to-be-amplified signal, or the envelope of the to-be-amplified signal may be obtained by using another circuit such as a diode detector circuit, a triode detector circuit, and a synchronization detection circuit, which is not limited in this embodiment.

S102. Acquire a first voltage corresponding to the envelope when the state of the envelope is the falling edge, and control the supply voltage of the power amplifier according to the first voltage.

Figure 3:
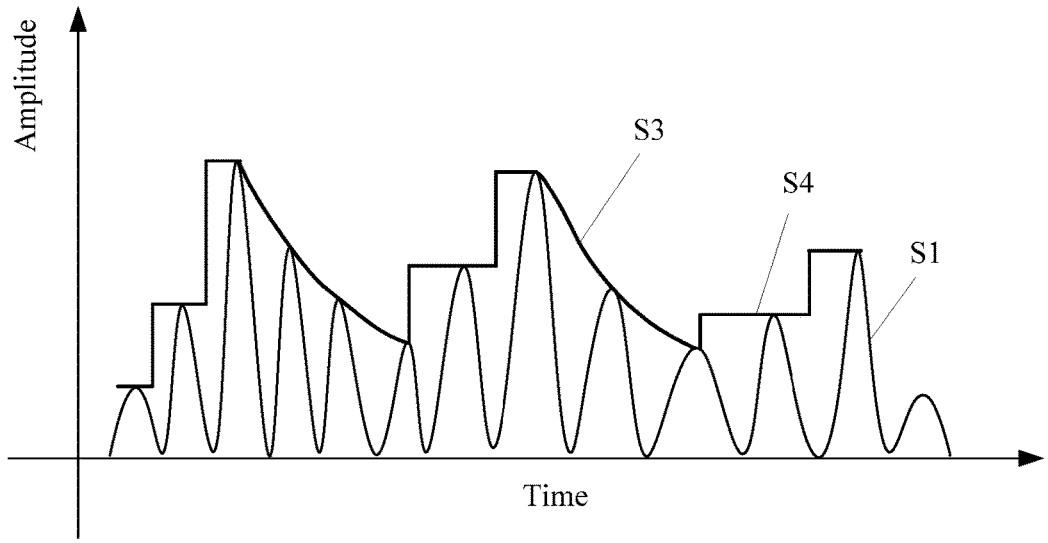
FIG. 3 is a schematic diagram of a supply voltage of a power amplifier according to an embodiment of the present invention.

Specifically, in an embodiment, as shown in FIG. 2 and FIG. 3, S1 is the to-be-amplified signal, S2 is the envelope of the to-be-amplified signal, and S3 is the first voltage corresponding to the envelope of the falling edge, where the first voltage is a voltage corresponding to at least one point on the envelop of the falling edge. After the state of the envelope of the to-be-amplified signal is determined, if it is determined that the state of the envelope is the falling edge, the first voltage corresponding to the envelope is acquired, and then the supply voltage of the power amplifier is controlled according to the first voltage.

S103. Acquire a second voltage corresponding to a maximum peak value of the to-be-amplified signal in a first preset time when the state of the envelope is the rising edge, and control, according to the second voltage, the supply voltage of the power amplifier in the first preset time.

Specifically, in an embodiment, as shown in FIG. 2 and FIG. 3, S1 is the to-be-amplified signal, S2 is the envelope of the to-be-amplified signal, and S4 is the second voltage corresponding to a peak value of the to-be-amplified signal in the first preset time. After the state of the envelope of the to-be-amplified signal is determined, if it is determined that the state of the envelope is the rising edge, the maximum peak value of the to-be-amplified signal in the first preset time is acquired; a pre-stored peak value and voltage correspondence table is searched for a voltage corresponding to the maximum peak value of the to-be-amplified signal in the first preset time, to obtain the second voltage, and then the supply voltage of the power amplifier is controlled according to the second voltage in the first preset time.

The to-be-amplified signal may be a power signal (or a voltage signal); the maximum peak value of the to-be-amplified signal is a maximum power value of the to-be-amplified signal in the first preset time; the pre-stored peak value and voltage correspondence table is a pre-stored correspondence table of a maximum power value and a voltage; the correspondence table is obtained in a laboratory by tabulating, according to a minimum voltage value that can be reached by a power amplifier PA under a condition of meeting a radio frequency indicator when target power is transmitted, each power and a minimum voltage value that can be reached under a condition that the power meets a radio frequency indicator, and is stored in a memory.

According to the method for controlling a supply voltage of a power amplifier provided in this embodiment of the present invention, a state of an envelope of a to-be-amplified signal is acquired, where the state of the envelope includes a rising edge and a falling edge; a first voltage corresponding to the envelope is acquired when the state of the envelope is the falling edge, and the supply voltage of the power amplifier is controlled according to the first voltage; and a second voltage corresponding to a maximum peak value of the to-be-amplified signal in a first preset time is acquired when the state of the envelope is the rising edge, and the supply voltage of the power amplifier is controlled in the first preset time according to the second voltage. Based on this solution, the supply voltage of the power amplifier may be determined by determining the state of the envelope of the to-be-amplified signal; and if the state of the envelope is the falling edge, the supply voltage of the power amplifier is controlled according to the first voltage corresponding to the envelope; or if the state of the envelope is the rising edge, the supply voltage of the power amplifier is controlled according to the second voltage corresponding to the maximum peak value of the envelope in the first preset time. This reduces a blank area of the supply voltage of the power amplifier and a power loss, so that the supply voltage of the power amplifier is approximately equal to an actual operating voltage of the power amplifier, which reduces power consumption, and avoids distortion of the to-be-amplified signal.

Embodiment 2

Figure 4:
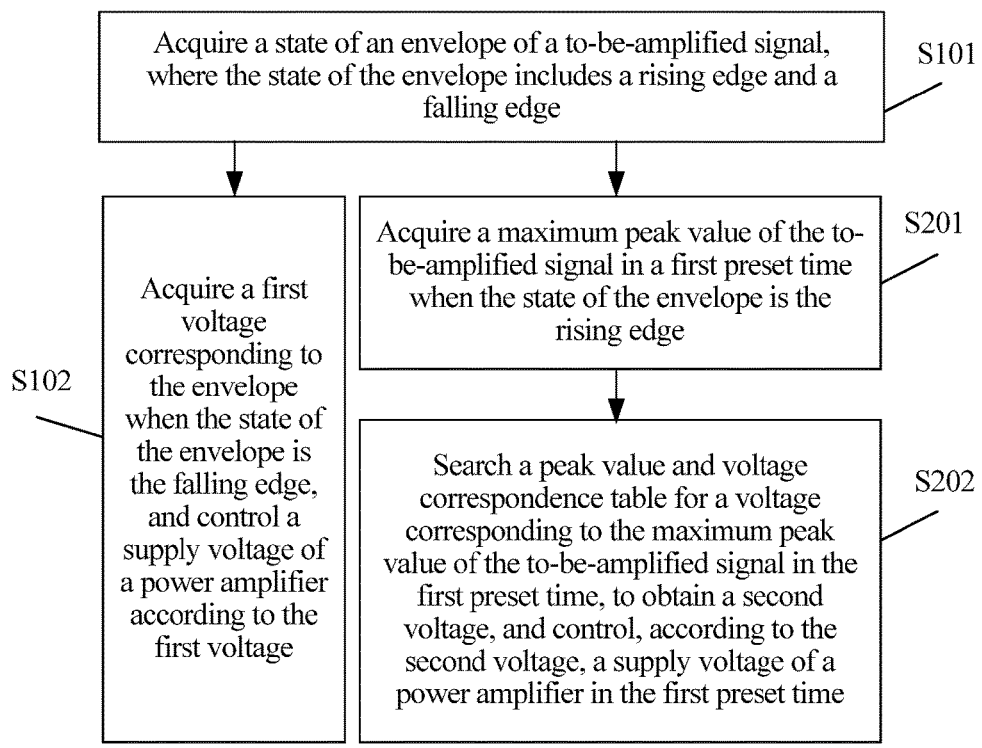
FIG. 4 is a schematic flowchart of a method for controlling a supply voltage of a power amplifier according to Embodiment 2 of the present invention.

This embodiment of the present invention provides a method for controlling a supply voltage of a power amplifier. As shown in FIG. 4, the method may include the following steps.

S101. Acquire a state of an envelope of a to-be-amplified signal, where the state of the envelope includes a rising edge and a falling edge.

It should be noted that the method for controlling a supply voltage of a power amplifier provided in this embodiment of the present invention may be executed by an electronic device, where the electronic device may be a mobile phone, a tablet computer, or the like, which is not limited in this embodiment.

For a high-frequency amplitude-modulated signal, amplitude of the signal changes according to a low-frequency modulated signal. If peak points of the high-frequency amplitude-modulated signal are connected, a curve corresponding to the low-frequency modulated signal may be obtained, and the curve is the envelope. First, the electronic device needs to acquire the to-be-amplified signal, and then acquires the envelope of the to-be-amplified signal by parsing the to-be-amplified signal. As shown in FIG. 2, S1 is the to-be-amplified signal, and S2 is the envelope of the to-be-amplified signal.

It should be supplemented that in this embodiment, the to-be-amplified signal may be parsed by using an envelope detector, to acquire the envelope of the to-be-amplified signal, or the envelope of the to-be-amplified signal may be acquired by using other software or circuits such as a diode detector circuit, a triode detector circuit, and a synchronization detection circuit, which is not limited in this embodiment.

Specifically, to enable the to-be-amplified signal to be synchronous with the supply voltage of the power amplifier, delay processing needs to be performed on the to-be-amplified signal, that is, the to-be-amplified signal needs to be delayed for a second preset time, so that the to-be-amplified signal is synchronous with the supply voltage of the power amplifier. The delay processing may be implemented by using a delay circuit, or may be implemented by using a software algorithm or another manner, which is not limited in this embodiment. The to-be-amplified signal is delayed for the second preset time, where the second preset time may be 20 ns, or may be another value set based on an actual requirement, which is not specifically limited in this embodiment.

A delay of the envelope and a delay of the to-be-amplified signal may be separately adjusted, so that the envelope and the to-be-amplified signal can synchronously reach the power amplifier, thereby avoiding signal distortion caused by asynchronization between the to-be-amplified signal voltage and the supply voltage of the power amplifier.

Specifically, after acquiring the envelope of the to-be-amplified signal, the electronic device needs to determine the state of the envelope of the to-be-amplified signal, that is, determine that the state of the envelope is the rising edge or the falling edge, acquires the state of the envelope of the to-be-amplified signal, and uses a different supply voltage control manner according to a different state of the envelope. If the state of the envelope is the falling edge, step S102 is used; if the state of the envelope is the rising edge, step S201 is used.

S102. Acquire a first voltage corresponding to the envelope when the state of the envelope is the falling edge, and control the supply voltage of the power amplifier according to the first voltage.

Specifically, as shown in FIG. 2 and FIG. 3, S1 is the to-be-amplified signal, S2 is the envelope of the to-be-amplified signal, and S3 is the first voltage corresponding to the envelope of the falling edge. After the state of the envelope of the to-be-amplified signal is determined, if it is determined that the state of the envelope is the falling edge, the first voltage corresponding to the envelope is acquired, and then the supply voltage of the power amplifier is controlled according to the first voltage.

Specifically, a frequency of the acquired envelope is relatively high (which is generally about 20 MHz). If output of a direct current to direct current converter (DCDC) is controlled by using the envelope, in a normal case, a requirement of a dynamic change can be met only when a frequency of the DCDC is above 40 M. However, if this solution is used, because the envelope of the falling edge monotonically descends, a DCDC response may be relatively slow when voltage control corresponding to the envelope is used upon the falling edge; because a voltage outputted by the DCDC is still higher compared with the to-be-amplified signal, no distortion occurs, that is, a DCDC whose frequency is about 3 MHz and that is commonly used at present may be used, and efficiency may be improved by 20% to 30%.

S201. Acquire a maximum peak value of the to-be-amplified signal in a first preset time when the state of the envelope is the rising edge.

Specifically, as shown in FIG. 2 and FIG. 3, S1 is the to-be-amplified signal, S2 is the envelope of the to-be-amplified signal, and S4 is a second voltage corresponding to a peak value of the to-be-amplified signal in the first preset time. After the state of the envelope of the to-be-amplified signal is determined, if it is determined that the state of the envelope is the rising edge, the maximum peak value of the to-be-amplified signal in the first preset time is acquired. The first preset time is a sampling time of the to-be-amplified signal, where the sampling time is generally less than duration of a data frame.

S202. Search a peak value and voltage correspondence table for a voltage corresponding to the maximum peak value of the to-be-amplified signal in the first preset time, to obtain a second voltage, and control, according to the second voltage, the supply voltage of the power amplifier in the first preset time.

Specifically, the electronic device may search the pre-stored peak value and voltage correspondence table for the voltage corresponding to the maximum peak value of the to-be-amplified signal in the first preset time, to obtain the second voltage. The to-be-amplified signal may be a power signal; the peak value of the to-be-amplified signal is a maximum power value of the to-be-amplified signal in the first preset time; the pre-stored peak value and voltage correspondence table is a pre-stored correspondence table of a maximum power value and a voltage; the correspondence table is obtained by tabulating, according to a minimum voltage value that can be reached by a power amplifier under a condition of meeting a radio frequency indicator when target power is transmitted, each power and a minimum voltage value that can be reached under a condition that the power meets a radio frequency indicator, and is stored in a memory.

Specifically, the electronic device may control the supply voltage of the power amplifier according to the second voltage. Because the frequency of the DCDC is relatively low, that is, a response corresponding to the envelope is slow, when the power increases, and voltage control corresponding to the peak value (that is, the maximum power value) in the first preset time is used, distortion caused by the slow DCDC response is avoided, which ensures that the signal is undistorted and reduces a cost on a basis that no additional pre-distortion processing component is added.

According to the method for controlling a supply voltage of a power amplifier provided in this embodiment of the present invention, a state of an envelope of a to-be-amplified signal is acquired, where the state of the envelope includes a rising edge and a falling edge; a first voltage corresponding to the envelope is acquired when the state of the envelope is the falling edge, and the supply voltage of the power amplifier is controlled according to the first voltage; and a second voltage corresponding to a maximum peak value of the to-be-amplified signal in a first preset time is acquired when the state of the envelope is the rising edge, and the supply voltage of the power amplifier is controlled in the first preset time according to the second voltage. Based on this solution, the supply voltage of the power amplifier may be determined by determining the state of the envelope of the to-be-amplified signal; and if the state of the envelope is the falling edge, the supply voltage of the power amplifier is controlled according to the first voltage corresponding to the envelope; or if the state of the envelope is the rising edge, the supply voltage of the power amplifier is controlled according to the second voltage corresponding to the maximum peak value of the envelope in the first preset time. This reduces a blank area of the supply voltage of the power amplifier and a power loss, so that the supply voltage of the power amplifier is approximately equal to an actual operating voltage of the power amplifier, which reduces power consumption, and avoids distortion of the to-be-amplified signal.

Embodiment 3

Figure 5:
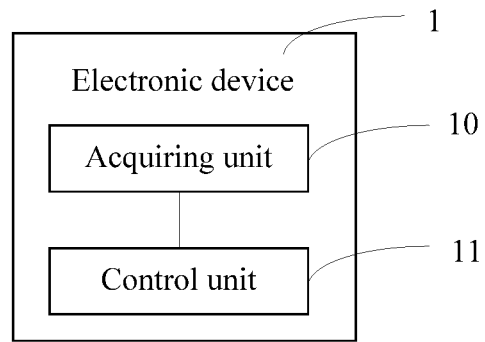
FIG. 5 is a first schematic structural diagram of an electronic device according to Embodiment 3 of the present invention.

This embodiment of the present invention provides an electronic device 1. As shown in FIG. 5, the electronic device 1 may include: an acquiring unit 10, configured to acquire a state of an envelope of a to-be-amplified signal, where the state of the envelope includes a rising edge and a falling edge, where the acquiring unit 10 is further configured to acquire a first voltage corresponding to the envelope when the state of the envelope is the falling edge; and a control unit 11, configured to control a supply voltage of a power amplifier according to the first voltage, where the acquiring unit 10 is further configured to acquire a second voltage corresponding to a maximum peak value of the to-be-amplified signal in a first preset time when the state of the envelope is the rising edge; and the control unit 11 is further configured to control, according to the second voltage, the supply voltage of the power amplifier in the first preset time.

In a possible implementation manner, the acquiring unit 10 is specifically configured to acquire the maximum peak value of the to-be-amplified signal in the first preset time when the state of the envelope is the rising edge, and search a peak value and voltage correspondence table for a voltage corresponding to the maximum peak value of the to-be-amplified signal in the first preset time, to obtain the second voltage.

Further, the electronic device 1 may further include: a storage unit 13, configured to store the peak value and voltage correspondence table, where the correspondence table stores a minimum voltage value that can be reached by the power amplifier in a laboratory according to target transmit power when a radio frequency indicator condition is met.

Further, the first preset time is less than duration of a data frame.

Further, the acquiring unit 10 is further configured to acquire the to-be-amplified signal, and acquire the envelope of the to-be-amplified signal according to the to-be-amplified signal.

Figure 6:
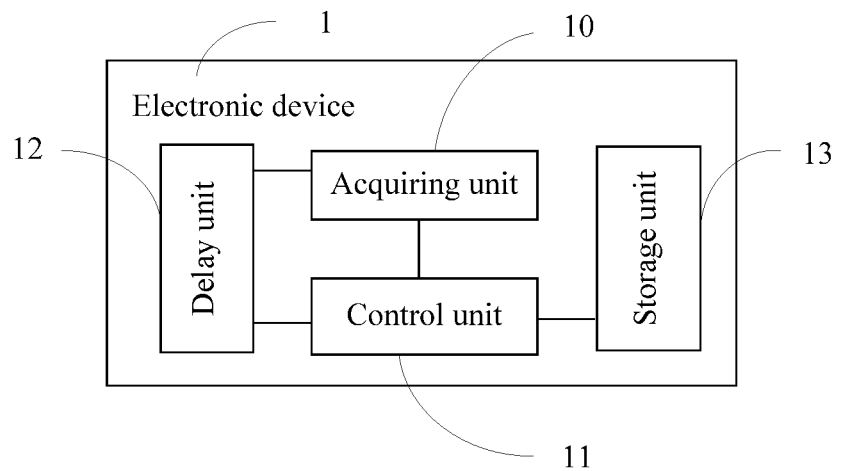
FIG. 6 is a second schematic structural diagram of an electronic device according to Embodiment 3 of the present invention.

Further, as shown in FIG. 6, in an embodiment, the electronic device may further include: a delay unit 12, configured to delay the to-be-amplified signal for a second preset time, so that the to-be-amplified signal is synchronous with the supply voltage of the power amplifier.

It should be noted that the electronic device provided in this embodiment of the present invention may be a mobile phone, a tablet computer, or the like, which is not limited in this embodiment.

Specifically, for a method for controlling the supply voltage of the power amplifier by using the electronic device, reference may be made to descriptions of Embodiment 1 and Embodiment 2, and no further details are provided in this embodiment of the present invention.

The electronic device provided in this embodiment of the present invention acquires a state of an envelope of a to-be-amplified signal, where the state of the envelope includes a rising edge and a falling edge; and acquires a first voltage corresponding to the envelope when the state of the envelope is the falling edge, and controls a supply voltage of a power amplifier according to the first voltage; or acquires a second voltage corresponding to a maximum peak value of the to-be-amplified signal in a first preset time when the state of the envelope is the rising edge, and controls, according to the second voltage, a supply voltage of a power amplifier in the first preset time. Based on this solution, the supply voltage of the power amplifier may be determined by determining the state of the envelope of the to-be-amplified signal; and if the state of the envelope is the falling edge, the supply voltage of the power amplifier is controlled according to the first voltage corresponding to the envelope; or if the state of the envelope is the rising edge, the supply voltage of the power amplifier is controlled according to the second voltage corresponding to the maximum peak value of the envelope in the first preset time. This reduces a blank area of the supply voltage of the power amplifier and a power loss, so that the supply voltage of the power amplifier is approximately equal to an actual operating voltage of the power amplifier, which reduces power consumption, and avoids distortion of the to-be-amplified signal.

Embodiment 4

Figure 7:
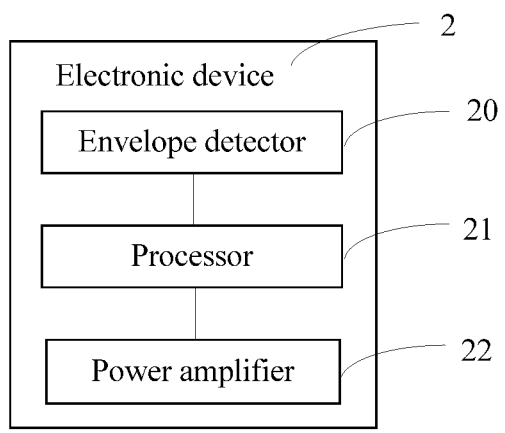
FIG. 7 is a first schematic structural diagram of an electronic device according to Embodiment 4 of the present invention.

This embodiment of the present invention provides an electronic device 2. As shown in FIG. 7, the electronic device 2 may include an envelope detector 20, a processor 21, and a power amplifier 22, where the envelope detector 20 is coupled with the processor 21, and the processor 21 is coupled with the power amplifier 22.

The envelope detector 20 may be a diode detector or another detector circuit. The electronic device 2 may be a mobile phone, a tablet computer, or the like, which is not limited in this embodiment.

Specifically, the envelope detector 20 is configured to acquire a state of an envelope of a to-be-amplified signal, where the state of the envelope includes a rising edge and a falling edge. The processor 21 is configured to acquire a first voltage corresponding to the envelope when the state of the envelope is the falling edge, and control a supply voltage of the power amplifier 22 according to the first voltage, where the first voltage is a voltage corresponding to at least one point on the envelop of the falling edge; and acquire a second voltage corresponding to a maximum peak value of the to-be-amplified signal in a first preset time when the state of the envelope is the rising edge, and control, according to the second voltage, the supply voltage of the power amplifier 22 in the first preset time.

Figure 8:
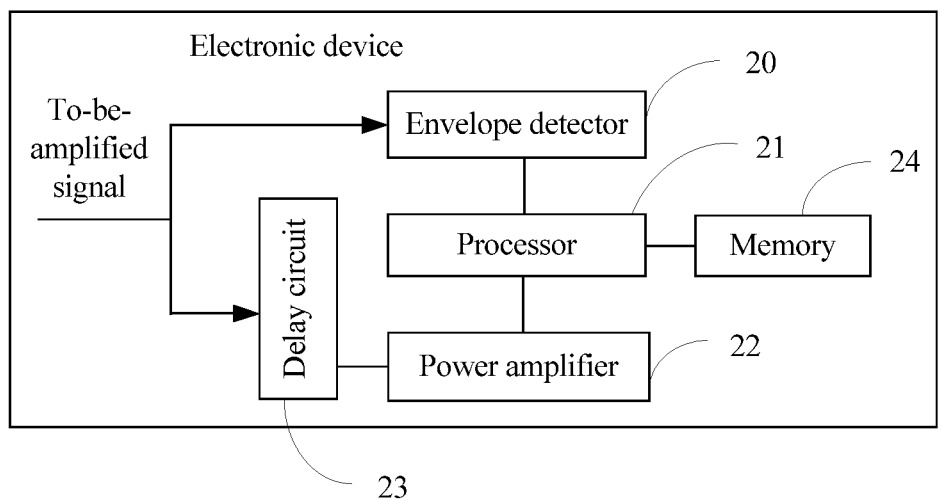
FIG. 8 is a second schematic structural diagram of an electronic device according to Embodiment 4 of the present invention.

Further, as shown in FIG. 8, the electronic device 2 may further include: a memory 24, where the memory 24 may be configured to store a peak value and voltage correspondence table, and the correspondence table stores a correspondence between a minimum voltage value that can be reached by the power amplifier under a condition of meeting a radio frequency indicator when target power is transmitted and the target power. The acquiring a second voltage corresponding to a maximum peak value of the to-be-amplified signal in a first preset time, and controlling, according to the second voltage, the supply voltage of the power amplifier 22 in the first preset time specifically includes: acquiring the maximum peak value of the to-be-amplified signal in the first preset time; and searching the pre-stored peak value and voltage correspondence table in the memory 24 for a voltage corresponding to the maximum peak value of the to-be-amplified signal in the first preset time, to obtain the second voltage. The first preset time may be less than duration of a data frame.

Further, the envelope detector 20 is further configured to acquire the to-be-amplified signal, and acquire the envelope of the to-be-amplified signal according to the to-be-amplified signal.

Further, as shown in FIG. 8, in an embodiment, the electronic device 2 may further include: a delay circuit 23, where the delay circuit 23 may delay the to-be-amplified signal for a second preset time, so that the to-be-amplified signal is synchronous with the supply voltage of the power amplifier 22.

Figure 9:
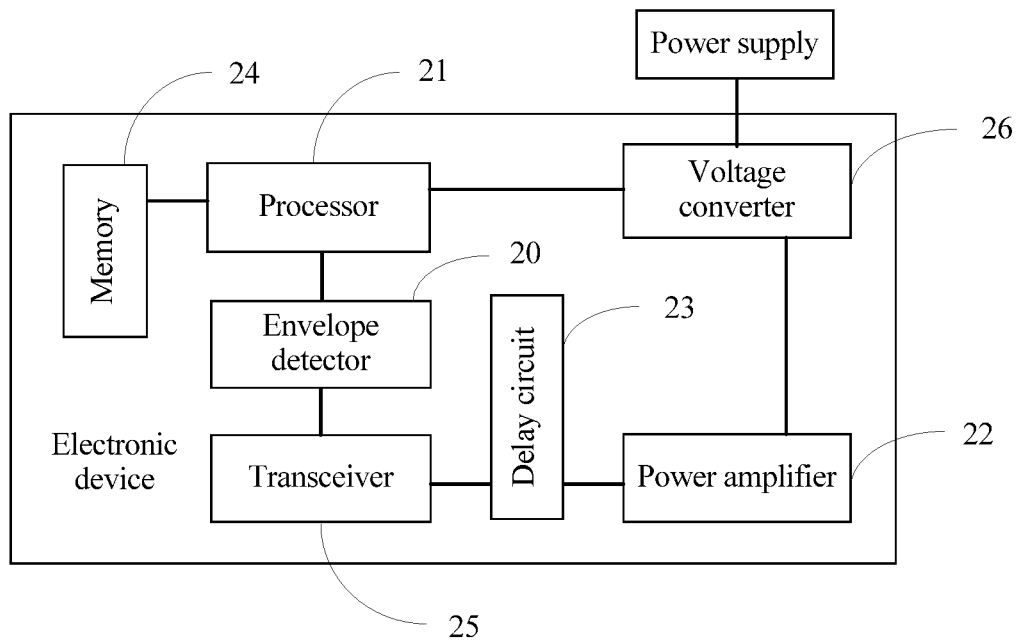
FIG. 9 is a third schematic structural diagram of an electronic device according to Embodiment 4 of the present invention.

As shown in FIG. 9, an embodiment of the present invention further provides an electronic device. The electronic device may include an envelope detector 20, a processor 21, a power amplifier 22, a delay circuit 23, a memory 24, a transceiver 25, and a voltage converter 26, where the memory 24 is coupled with the processor 21, the processor 21 is separately coupled with the envelope detector 20 and the voltage converter 26, the envelope detector 20 is coupled with the transceiver 25, the transceiver 25 is coupled with the delay circuit 23, the delay circuit 23 is coupled with the power amplifier 22, and the power amplifier 22 is coupled with the voltage converter 26. Specifically, the transceiver 25 is configured to acquire a to-be-amplified signal, perform processing such as modulation, demodulation and digital-to-analog conversion on the to-be-amplified signal, and transmit the to-be-amplified signal to the delay circuit 23, where the delay circuit 23 performs delay processing on the to-be-amplified signal and transmits the delayed to-be-amplified signal to the power amplifier 22; the envelope detector 20 is configured to acquire a state of an envelope of the to-be-amplified signal; the processor 21 is configured to acquire control voltages corresponding to different states of the envelope; and the voltage converter 26 is configured to adjust a supply voltage of the power amplifier according to a control voltage outputted by the processor 21.

Figure 10:
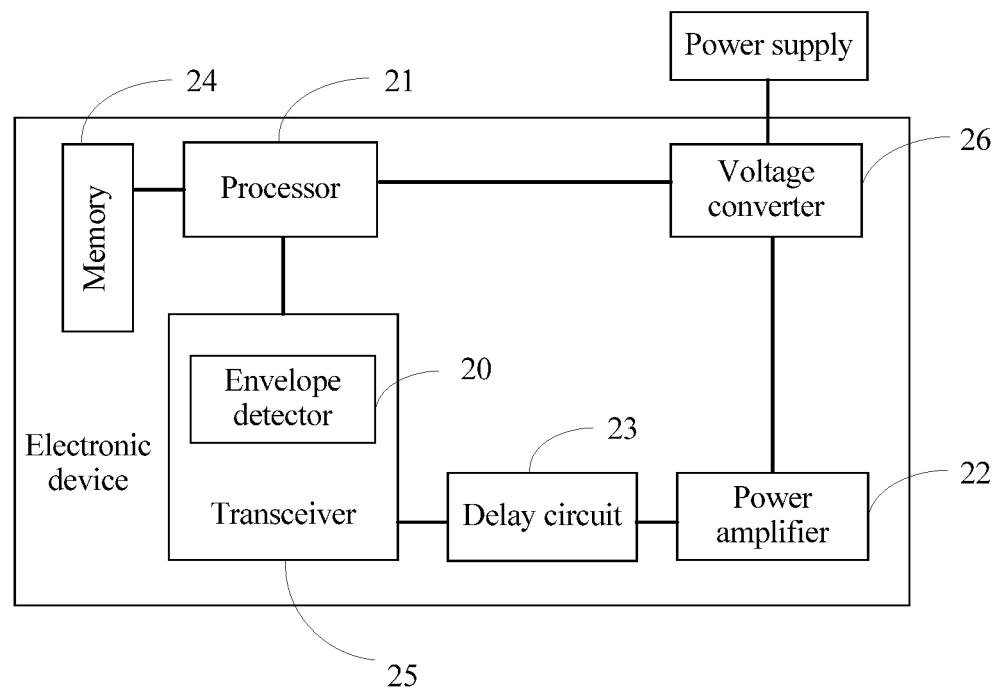
FIG. 10 is a fourth schematic structural diagram of an electronic device according to Embodiment 4 of the present invention.

As shown in FIG. 10, an embodiment of the present invention further provides an electronic device. The electronic device may include an envelope detector 20, a processor 21, a power amplifier 22, a delay circuit 23, a memory 24, a transceiver 25, and a voltage converter 26, where the memory 24 is coupled with the processor 21, the processor 21 is separately coupled with the transceiver 25 and the voltage converter 26, the transceiver 25 is coupled with the delay circuit 23, the delay circuit 23 is coupled with the power amplifier 22, and the power amplifier 22 is coupled with the voltage converter 26. Specifically, the transceiver 25 is configured to acquire a to-be-amplified signal, perform processing such as modulation, demodulation and digital-to-analog conversion on the to-be-amplified signal, and transmit the to-be-amplified signal to the delay circuit 23, where the delay circuit 23 performs delay processing on the to-be-amplified signal and transmits the delayed to-be-amplified signal to the power amplifier 22; the envelope detector 20 is configured to acquire a state of an envelope of the to-be-amplified signal; the processor 21 is configured to acquire control voltages corresponding to different states of the envelope; and the voltage converter 26 is configured to adjust a supply voltage of the power amplifier according to a control voltage outputted by the processor 21.

Specifically, a voltage converter may be a DC/DC converter; a transceiver may be a radio frequency transceiver RF Transceiver.

Specifically, for a method for controlling the supply voltage of the power amplifier by using the electronic device, reference may be made to descriptions of Embodiment 1 and Embodiment 2, and no further details are provided in this embodiment of the present invention.

The electronic device provided in this embodiment of the present invention acquires a state of an envelope of a to-be-amplified signal, where the state of the envelope includes a rising edge and a falling edge; and acquires a first voltage corresponding to the envelope when the state of the envelope is the falling edge, and controls a supply voltage of a power amplifier according to the first voltage; or acquires a second voltage corresponding to a maximum peak value of the to-be-amplified signal in a first preset time when the state of the envelope is the rising edge, and controls, according to the second voltage, a supply voltage of a power amplifier in the first preset time. Based on this solution, the supply voltage of the power amplifier may be determined by determining the state of the envelope of the to-be-amplified signal; and if the state of the envelope is the falling edge, the supply voltage of the power amplifier is controlled according to the first voltage corresponding to the envelope; or if the state of the envelope is the rising edge, the supply voltage of the power amplifier is controlled according to the second voltage corresponding to the maximum peak value of the envelope in the first preset time. This reduces a blank area of the supply voltage of the power amplifier and a power loss, so that the supply voltage of the power amplifier is approximately equal to an actual operating voltage of the power amplifier, which reduces power consumption, and avoids distortion of the to-be-amplified signal.

The to-be-amplified signal in the embodiments described above may be a radio frequency signal, an audio signal, or the like, which is not limited in this application.

In the several embodiments provided in this application, it should be understood that the disclosed system, apparatus, and method may be implemented in other manners. For example, the described apparatus embodiment is merely exemplary. For example, the module or unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual needs to achieve the objectives of the solutions of the embodiments.

In addition, functional units in the embodiments of the present invention may be integrated into one processing unit, or each of the units may exist alone physically, or two or more units are integrated into one unit. The integrated unit may be implemented in a form of hardware, or may be implemented in a form of a software functional unit.

The foregoing descriptions are merely specific implementation manners of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A method, comprising:
   acquiring a state of an envelope of a to-be-amplified signal, wherein the state of the envelope comprises a rising edge or a falling edge;
   when the state of the envelope is the falling edge, acquiring a first voltage corresponding to the envelope, and controlling a supply voltage of a power amplifier according to the first voltage; and when the state of the envelope is the rising edge, acquiring a maximum peak value of the to-be-amplified signal in a first preset time, and searching a peak value and voltage correspondence table for a voltage corresponding to the maximum peak value of the to-be-amplified signal in the first preset time, to obtain a second voltage.

2. The method according to claim 1, wherein the first preset time is less than a duration of a data frame.

3. The method according to claim 1, wherein before acquiring the state of an envelope of the to-be-amplified signal, the method further comprises:
acquiring the to-be-amplified signal, and delaying the to-be-amplified signal for a second preset time, wherein after the to-be-amplified signal is delayed the to-be-amplified signal is synchronous with the supply voltage of the power amplifier.

4. An electronic device, comprising:
an acquiring unit, configured to:
acquire a state of an envelope of a to-be-amplified signal, wherein the state of the envelope comprises a rising edge or a falling edge; and
when the state of the envelope is the falling edge, acquire a first voltage corresponding to the envelope; and
when the state of the envelope is the rising edge, acquire a maximum peak value of the to-be-amplified signal in a first preset time, and to search a peak value and voltage correspondence table for a voltage corresponding to the maximum peak value of the to-be-amplified signal in the first preset time, to obtain a second voltage; and
a control unit, configured to:
control a supply voltage of a power amplifier according to the first voltage; or
control, according to the second voltage, the supply voltage of the power amplifier in the first preset time.

5. The electronic device according to claim 4, wherein the first preset time is less than a duration of a data frame.

6. The electronic device according to claim 5, wherein the electronic device further comprises a delay unit;
wherein the acquiring unit is further configured to acquire the to-be-amplified signal; and
wherein the delay unit is configured to delay the to-be-amplified signal for a second preset time, wherein after the to-be-amplified signal is delayed the to-be-amplified signal is synchronous with the supply voltage of the power amplifier.

7. The electronic device according to claim 4, wherein the electronic device further comprises a delay unit;
wherein the acquiring unit is further configured to acquire the to-be-amplified signal; and
wherein the delay unit is configured to delay the to-be-amplified signal for a second preset time, wherein after the to-be-amplified signal is delayed the to-be-amplified signal is synchronous with the supply voltage of the power amplifier.

8. An electronic device, comprising:
an envelope detector, configured to acquire a state of an envelope of a to-be-amplified signal, wherein the state of the envelope comprises a rising edge or a falling edge; and
a processor, configured to:
when the state of the envelope is the falling edge, acquire a first voltage corresponding to the envelope, and control a supply voltage of a power amplifier according to the first voltage; and
when the state of the envelope is the rising edge, acquire a maximum peak value of the to-be-amplified signal in a first preset time, and search a peak value and voltage correspondence table for a voltage corresponding to the maximum peak value of the to-be-amplified signal in the first preset time, to obtain a second voltage.

9. The electronic device according to claim 8, wherein the first preset time is less than a duration of a data frame.

10. The electronic device according to claim 9, wherein the electronic device further comprises a delay circuit;
wherein the envelope detector is further configured to acquire the to-be-amplified signal; and
wherein the delay circuit is configured to delay the to-be-amplified signal for a second preset time, wherein after the to-be-amplified signal is delayed the to-be-amplified signal is synchronous with the supply voltage of the power amplifier.

11. The electronic device according to claim 8, wherein the electronic device further comprises a delay circuit;
wherein the envelope detector is further configured to acquire the to-be-amplified signal; and
wherein the delay circuit is configured to delay the to-be-amplified signal for a second preset time, wherein after the to-be-amplified signal is delayed the to-be-amplified signal is synchronous with the supply voltage of the power amplifier.

* * * * *